(12) United States Patent
Shimura et al.

(10) Patent No.: US 9,741,559 B2
(45) Date of Patent: Aug. 22, 2017

(54) FILM FORMING METHOD, COMPUTER STORAGE MEDIUM, AND FILM FORMING SYSTEM

(71) Applicant: Tokyo Electron Limited, Tokyo (JP)

(72) Inventors: Satoru Shimura, Koshi (JP); Fumiko Iwao, Tokyo (JP); Kousuke Yoshihara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 18 days.

(21) Appl. No.: 14/764,687

(22) PCT Filed: Jan. 23, 2014

(86) PCT No.: PCT/JP2014/051361
§ 371 (c)(1),
(2) Date: Jul. 30, 2015

(87) PCT Pub. No.: WO2014/129259
PCT Pub. Date: Aug. 28, 2014

(65) Prior Publication Data
US 2015/0357188 A1  Dec. 10, 2015

(30) Foreign Application Priority Data

Feb. 22, 2013 (JP) .................................. 2013-033216

(51) Int. Cl.
*H01L 21/02* (2006.01)
*B05C 9/12* (2006.01)
(Continued)

(52) U.S. Cl.
CPC .......... *H01L 21/02348* (2013.01); *B05C 9/12* (2013.01); *B05C 9/14* (2013.01);
(Continued)

(58) Field of Classification Search
CPC .......... H01L 21/02348; H01L 21/0271; H01L 21/67098
See application file for complete search history.

(56) References Cited

U.S. PATENT DOCUMENTS

| 5,633,739 | A | * | 5/1997 | Matsuyama | ........... B41M 5/265 |
|---|---|---|---|---|---|
| | | | | | 349/106 |
| 7,014,521 | B1 | * | 3/2006 | Fujiike | ................... G02B 5/201 |
| | | | | | 445/24 |
| 2014/0030833 | A1 | | 1/2014 | Sato et al. | |

FOREIGN PATENT DOCUMENTS

| JP | 61-194830 A | 8/1986 |
|---|---|---|
| JP | 03-246942 A | 11/1991 |

(Continued)

OTHER PUBLICATIONS

International Search Report of the International Searching Authority mailed May 13, 2014 for the corresponding international application No. PCT/JP2014/051361 (and English translation).

*Primary Examiner* — Armando Rodriguez
(74) *Attorney, Agent, or Firm* — Posz Law Group, PLC

(57) ABSTRACT

The present invention is to form an organic film on a substrate having a pattern formed on a front surface thereof and configured to: apply an organic material onto the substrate; then thermally treat the organic material to form an organic film on the substrate; and then perform ultraviolet irradiation processing on the organic film to remove a surface of the organic film down to a predetermined depth, thereby appropriately and efficiently form the organic film on the substrate.

16 Claims, 14 Drawing Sheets

(51) Int. Cl.
*B05C 9/14* (2006.01)
*B05C 11/10* (2006.01)
*H01L 21/66* (2006.01)
*H01L 21/3105* (2006.01)
*H01L 21/311* (2006.01)
*H01L 21/67* (2006.01)
*H01L 21/027* (2006.01)
*B05C 11/08* (2006.01)

(52) U.S. Cl.
CPC ...... *B05C 11/1015* (2013.01); *H01L 21/0271* (2013.01); *H01L 21/31055* (2013.01); *H01L 21/31138* (2013.01); *H01L 21/6715* (2013.01); *H01L 21/6719* (2013.01); *H01L 21/67109* (2013.01); *H01L 21/67115* (2013.01); *H01L 21/67178* (2013.01); *H01L 22/20* (2013.01); *H01L 22/26* (2013.01); *B05C 11/08* (2013.01); *H01L 21/02118* (2013.01); *H01L 22/12* (2013.01)

(56) References Cited

FOREIGN PATENT DOCUMENTS

| | | | |
|---|---|---|---|
| JP | 06-267909 | * | 9/1994 |
| JP | H06-267909 A | | 9/1994 |
| JP | 2000-241819 A | | 9/2000 |
| JP | 2003-218116 A | | 7/2003 |
| JP | 2009-094218 | * | 4/2009 |
| JP | 2009-094218 A | | 4/2009 |
| JP | 2009-164519 A | | 7/2009 |
| TW | 201304229 A | | 1/2013 |
| WO | 2012/165263 A1 | | 12/2012 |

\* cited by examiner

FILM FORMING METHOD, COMPUTER STORAGE MEDIUM, AND FILM FORMING SYSTEM

TECHNICAL FIELD

The present invention relates to a film forming method of forming an organic film on a substrate having a pattern formed on a front surface thereof, a computer storage medium, and a film forming system for performing the film forming method.

This application is based upon and claims the benefit of priority of the prior Japanese Patent Application No. 2013-033216, filed in Japan on Feb. 22, 2013, the entire contents of which are incorporated herein by reference.

BACKGROUND ART

For example, in a manufacturing process of a semiconductor device in a multilayer wiring structure, a resist coating treatment of applying a resist solution, for example, onto a semiconductor wafer (hereinafter, referred to as a "wafer") to form a resist film, exposure processing of exposing a predetermined pattern to the resist film, a developing treatment of developing the exposed resist film and so on are performed in sequence to thereby form a predetermined resist pattern on the wafer. Using the resist pattern as a mask, an etching treatment for the wafer is performed, and then a removal treatment of the resist film and so on are performed to form a predetermined pattern on the wafer. The process of forming the predetermined pattern in a predetermined layer is repeatedly performed multiple rounds to manufacture the semiconductor device in a multilayer wiring structure.

Incidentally, in the case where the predetermined pattern is repeatedly formed on the wafer as described above, the surface to which the resist solution is applied needs to be flat in order to form a resist film in an (n+1)-th layer at an appropriate height after a predetermined pattern is formed in an n-th layer.

Hence, conventionally, an organic film is formed on the predetermined pattern on the wafer and its surface is planarized. The formation of the organic film is performed by applying an organic material onto the wafer, heating the applied organic material to form an organic film, and etching back the organic film by, for example, a dry etching method (reactive ion etching method) to remove the surface of the organic film (Patent Document 1). Further, as the organic film, for example, an SOC (Spin On Cap) film, an SOG (Spin On Glass) film or the like is used.

PRIOR ART DOCUMENT

Patent Document

[Patent Document 1] Japanese Patent Application Laid-open No. 2003-218116

DISCLOSURE OF THE INVENTION

Problems to be Solved by the Invention

In the case of using the method described in the above-described Patent Document 1, the application of the organic material and the heating of the organic material are performed under a normal pressure atmosphere, whereas the etchback of the organic film is performed under a vacuum atmosphere. Thus, the treatment under the normal pressure atmosphere and the treatment under the vacuum atmosphere need to be performed in separate systems and the wafer needs to be transferred between the systems. Therefore, the manufacturing cost of the system is increased, and the throughput of the wafer treatment is also decreased.

Further, in the case where the etchback of the organic film is performed by the dry etching method, there is a possibility that plasma damages the wafer or the film on the wafer. Furthermore, there also is a possibility that the plasma changes the quality of the film on the wafer.

The present invention has been made in consideration of the above points and its object is to appropriately and efficiently form an organic film on a substrate having a pattern formed on a front surface thereof.

Means for Solving the Problems

To achieve the above object, the present invention is a film forming method of forming an organic film on a substrate having a pattern formed on a front surface thereof, the method including: a coating treatment step of applying an organic material onto the substrate; a thermal treatment step of then thermally treating the organic material to form an organic film on the substrate; and an ultraviolet irradiation step of then performing ultraviolet irradiation processing on the organic film to remove a surface of the organic film down to a predetermined depth.

According to the present invention, at the ultraviolet irradiation step, the ultraviolet irradiation processing is performed on the organic film. Specifically, ultraviolet rays are radiated to generate active oxygen and ozone in the treatment atmosphere, and the active oxygen and ozone decompose and remove the surface of the organic film. Further, the surface of the organic film is removed so that a difference between a surface height in a region where the pattern is formed and a surface height in a region where a recessed part between the patterns is formed falls within a predetermined range. Thus, even in the case where the organic film is formed on the substrate having the pattern formed on the front surface thereof, the surface of the organic film can be planarized.

Further, the ultraviolet irradiation processing removes the surface of the organic film, thus preventing damage to the substrate or the film on the substrate unlike the case of performing the conventional dry etching method and also eliminating the possibility that the quality of the film on the substrate is changed. Accordingly, an organic film can be appropriately formed on the substrate.

In addition, according to the present invention, all of the coating treatment step, the thermal treatment step, and the ultraviolet irradiation step can be performed under the normal pressure atmosphere, and these steps can be performed in one system. Therefore, the manufacturing cost of the system can be reduced, and the throughput of the substrate treatment can be improved.

The present invention according to another aspect is a computer-readable storage medium storing a program running on a computer of a control unit controlling the film forming system to cause the film forming system to perform the film forming method.

The present invention according to still another aspect is a film forming system for forming an organic film on a substrate having a pattern formed on a front surface thereof, the system including: a coating treatment unit that applies an organic material onto the substrate; a thermal treatment unit that thermally treats the organic material to form an organic film on the substrate; an ultraviolet irradiation unit that performs ultraviolet irradiation processing on the organic film; and a control unit that controls the coating treatment unit, the thermal treatment unit, and the ultraviolet irradiation unit to perform the coating treatment, the thermal treatment, and the ultraviolet irradiation processing in this order and remove a surface of the organic film down to a predetermined depth in the ultraviolet irradiation processing.

Effect of the Invention

According to the present invention, it is possible to appropriately and efficiently form an organic film on a substrate having a pattern formed on a front surface thereof.

BEST MODE FOR CARRYING OUT THE INVENTION

Figure 1:
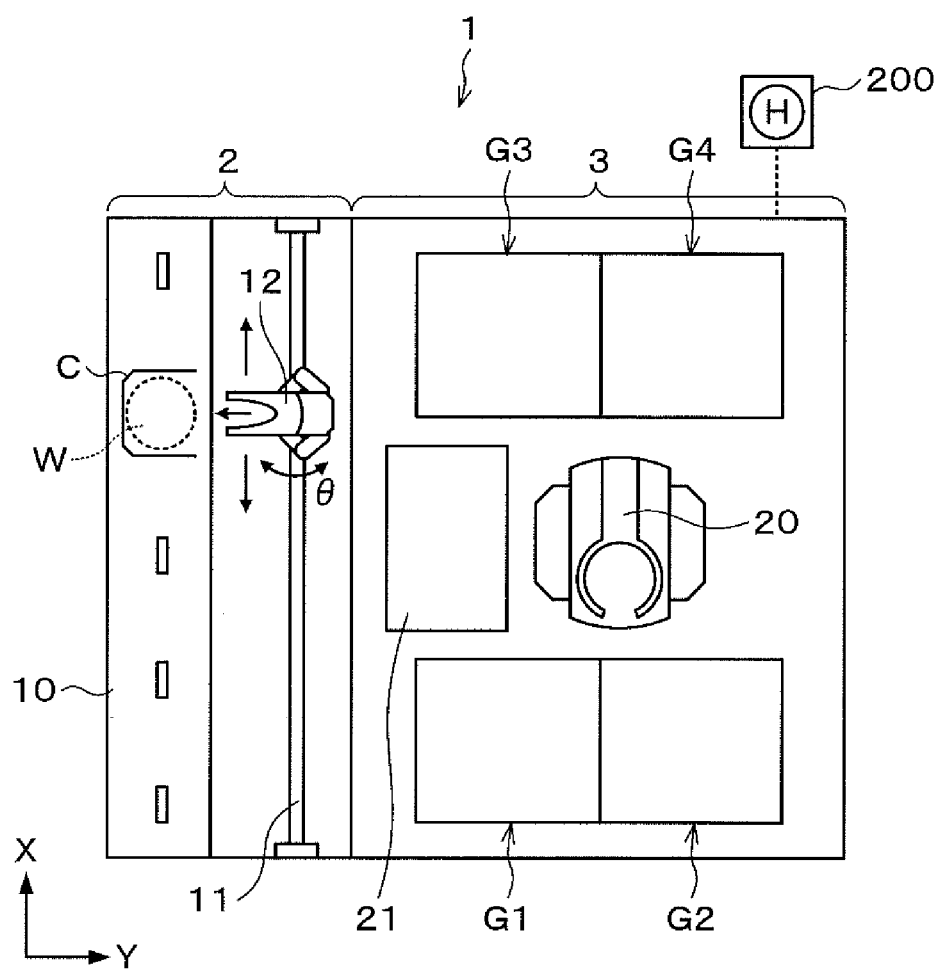
FIG. 1 A plan view illustrating the outline of a configuration of a film forming system according to an embodiment.
Figure 2:
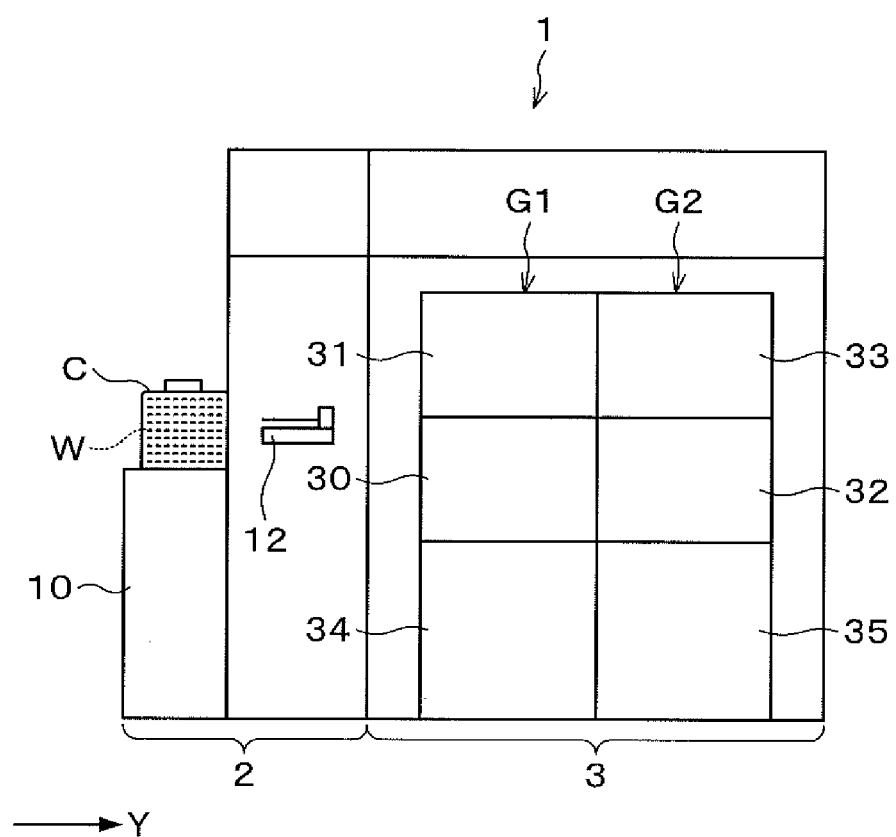
FIG. 2 A side view illustrating the outline of an internal configuration of the film forming system according to this embodiment.
Figure 3:
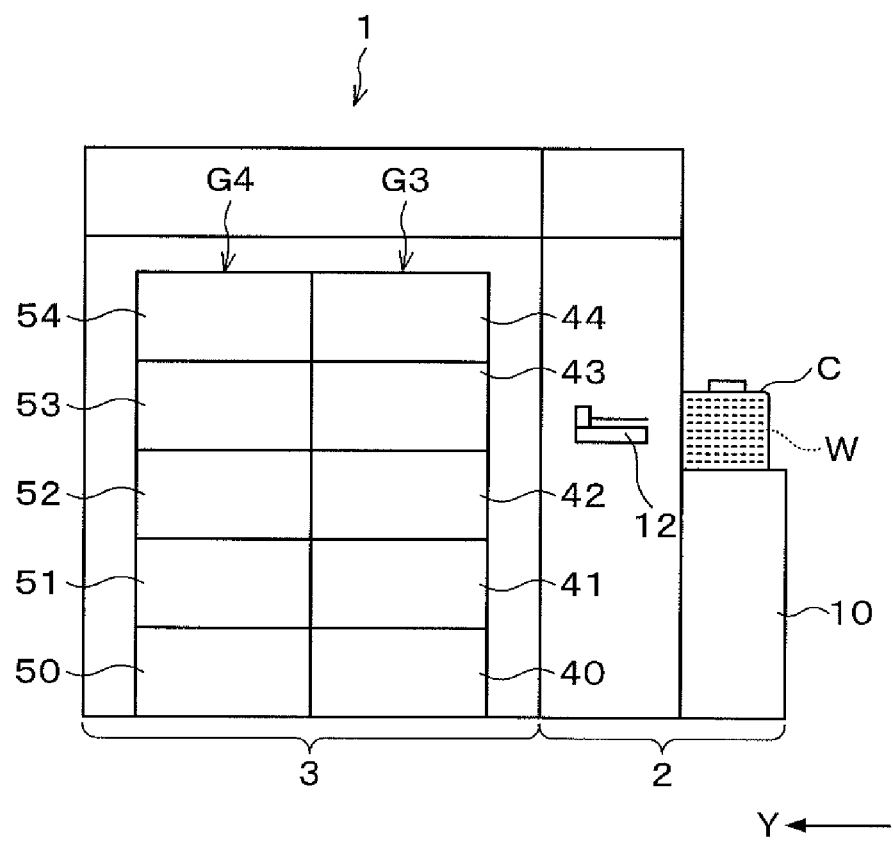
FIG. 3 A side view illustrating the outline of the internal configuration of the film forming system according to this embodiment.

Hereinafter, embodiments of the present invention will be described. FIG. 1 is a plan view illustrating the outline of a configuration of a film forming system 1 according to this embodiment. FIG. 2 and FIG. 3 are side views illustrating the outline of an internal configuration of the film forming system 1. Note that in the film forming system 1 in this embodiment, a case where an organic film being an SOC film is formed on a wafer W as a substrate. On the wafer W to be treated in the film forming system 1, a predetermined pattern such as a $SiO_2$ film has been formed in advance.

The film forming system 1 has, as illustrated in FIG. 1, a configuration in which, for example, a cassette station 2 which transfers a plurality of, for example, 25 wafers W as a cassette unit in/out between the outside and the film forming system 1 and transfers a wafer W into/out of a cassette C, and a treatment station 3 which includes a plurality of treatment apparatuses that perform predetermined treatments on the wafer W, are integrally connected.

In the cassette station 2, a cassette mounting table 10 is provided. On the cassette mounting table 10, a plurality of cassettes C can be mounted in a line in an X-direction (a top-down direction in FIG. 1). In short, the cassette station 2 is configured to be capable of retaining a plurality of wafers W.

In the cassette station 2, a wafer transfer body 12 is provided which is movable on a transfer path 11 extending in the X-direction. The wafer transfer body 12 is movable also in a vertical direction and around a vertical axis (in a θ-direction), and can transfer the wafer W between the cassette C and the treatment station 3.

In the treatment station 3, a wafer transfer apparatus 20 is provided at its central portion. Around the wafer transfer apparatus 20, for example, four treatment blocks G1 to G4 are arranged each having multi-tiered various treatment apparatuses. On the front side (an X-direction negative direction side in FIG. 1) in the treatment station 3, the first treatment block G1 and the second treatment block G2 are provided in sequence from the cassette station 2 side. On the rear side (an X-direction positive direction side in FIG. 1) in the treatment station 3, the third treatment block G3 and the fourth treatment block G4 are provided in sequence from the cassette station 2 side. On the cassette station 2 side in the treatment station 3, a delivery apparatus 21 is provided for delivering the wafer W. The wafer transfer apparatus 20 can transfer the wafer W to later-described various treatment apparatuses arranged in the treatment blocks G1 to G4 and the delivery apparatus 21.

In the first treatment block G1, as illustrated in FIG. 2, a plurality of solution treatment apparatuses, for example, coating treatment apparatuses 30, 31 each as a coating treatment unit that applies an organic material for forming an organic film on the wafer W are two-tiered in order from the bottom. Also in the second treatment block G2, coating treatment apparatuses 32, 33 are similarly two-tiered in order from the bottom. Further, chemical chambers 34, 35 for supplying the organic materials to the coating treatment apparatuses 30 to 33 are provided respectively on the lowermost tiers of the first treatment block G1 and the second treatment block G2. Note that the organic material is, for example, liquid made by dissolving a composition of the SOC film being the organic film in a predetermined solvent.

In the third treatment block G3, as illustrated in FIG. 3, wafer treatment apparatuses 40, 41, 42 each of which performs a thermal treatment on the wafer W and performs ultraviolet irradiation processing on the wafer W and temperature regulation apparatuses 43, 44 each of which regulates the temperature of the wafer W are five-tiered in order from the bottom.

Also in the fourth treatment block G4, wafer treatment apparatuses 50, 51, 52 and temperature regulation apparatuses 53, 54 are five-tiered in order from the bottom as in the third treatment block G3.

Figure 4:
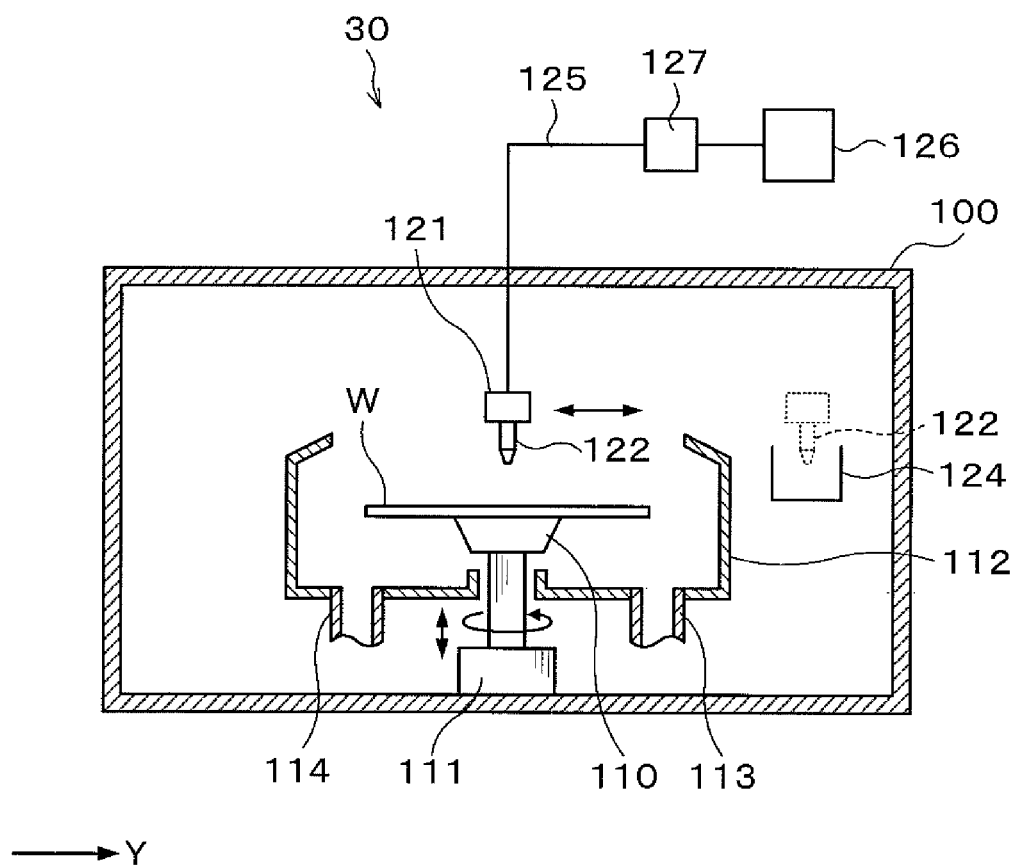
FIG. 4 A longitudinal sectional view illustrating the outline of a configuration of a coating treatment apparatus.

Next, the configurations of the above-described coating treatment apparatuses 30 to 33 will be described. The coating treatment apparatus 30 has a treatment container 100 which can hermetically close its inside as illustrated in FIG. 4. A transfer-in/out port (not illustrated) for the wafer W is formed, for example, in a side surface on the wafer transfer apparatus 20 side of the treatment container 100, and an opening/closing shutter (not illustrated) is provided at the transfer-in/out port.

At a central portion in the treatment container 100, a spin chuck 110 is provided which holds and rotates the wafer W thereon. The spin chuck 110 has a horizontal upper surface and, for example, a suction port (not illustrated) that sucks the wafer W is provided in the upper surface. By suction through the suction port, the wafer W can be suction-held on the spin chuck 110.

Below the spin chuck 110, a chuck drive part 111 equipped with, for example, a motor and the like is provided. The spin chuck 110 can rotate at a predetermined speed by means of the chuck drive part 111. Further, the chuck drive part 111 is provided with a raising and lowering drive source such as, for example, a cylinder so that the spin chuck 110 can freely rise and lower.

Around the spin chuck 110, a cup 112 is provided which receives and collects liquid splashing or dropping from the wafer W. A drain pipe 113 that drains the collected liquid and an exhaust pipe 114 that evacuates and exhausts the atmosphere in the cup 112 are connected to the lower surface of the cup 112.

Figure 5:
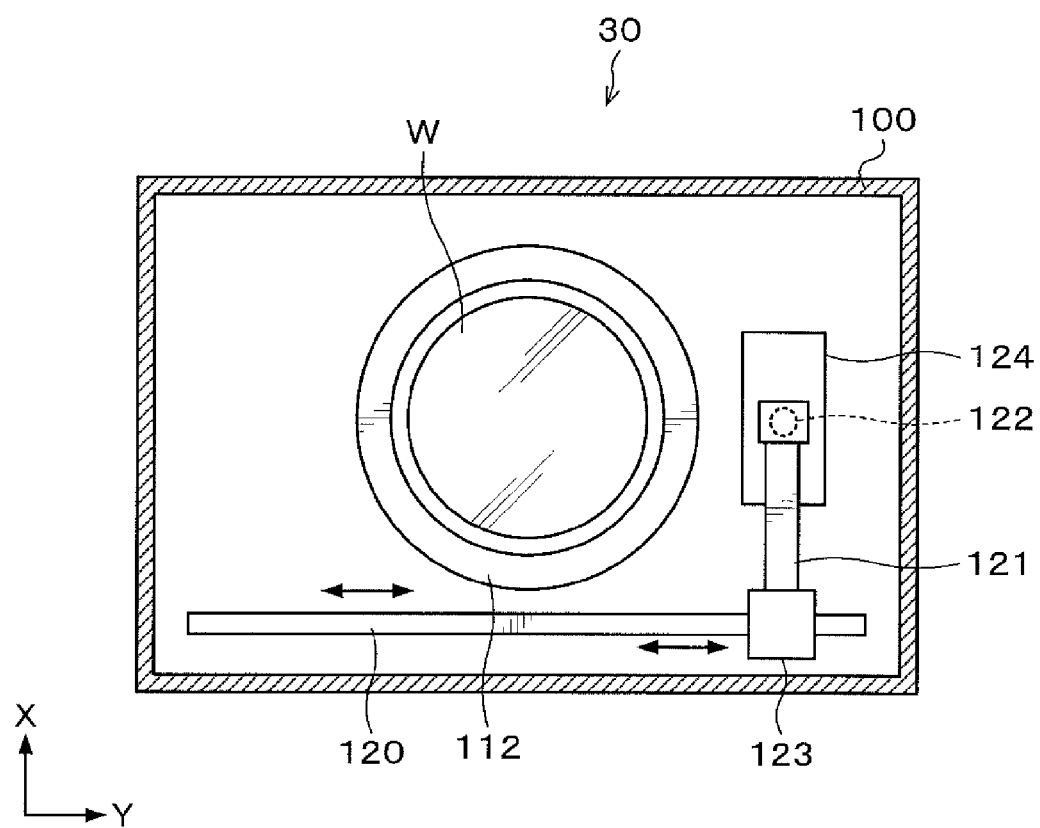
FIG. 5 A transverse sectional view illustrating the outline of the configuration of the coating treatment apparatus.

As illustrated in FIG. 5, on an X-direction negative direction (a lower direction in FIG. 5) side of the cup 112, a rail 120 extending along a Y-direction (a right-left direction in FIG. 5) is formed. The rail 120 is formed, for example, from a Y-direction negative direction (a left direction in FIG. 5) side outer position of the cup 112 to a Y-direction positive direction (a right direction in FIG. 5) side outer position. To the rail 120, for example, an arm 121 is attached.

On the arm 121, a coating nozzle 122 is supported which supplies an organic material onto the wafer W as illustrated in FIG. 4 and FIG. 5. The arm 121 is movable on the rail 120 by means of a nozzle drive part 123 illustrated in FIG. 5. Thus, the coating nozzle 122 can move from a waiting section 124 placed at the Y-direction positive direction side outer position of the cup 112 to a position above a central portion of the wafer W in the cup 112, and further move in the diameter direction of the wafer W above the wafer W. Further, the arm 121 can freely rise and lower by means of the nozzle drive part 123 to be able to adjust the height of the coating nozzle 122.

To the coating nozzle 122, a supply pipe 125 for supplying the organic material to the coating nozzle 122 is connected as illustrated in FIG. 4. The supply pipe 125 communicates with an organic material supply source 126 storing the organic material therein. The supply pipe 125 is further provided with a supply equipment group 127 including a valve, a flow regulator and so on for controlling the flow of the organic material.

Note that a back rinse nozzle (not illustrated) jetting a cleaning solution toward the rear surface of the wafer W may be provided below the spin chuck 110. The cleaning solution jetted from the back rinse nozzle cleans the rear surface of the wafer W and the outer peripheral portion of the wafer W.

Note that the configurations of the coating treatment apparatuses 31 to 33 are the same as that of the above-described coating treatment apparatus 30, and therefore description thereof is omitted.

Figure 6:
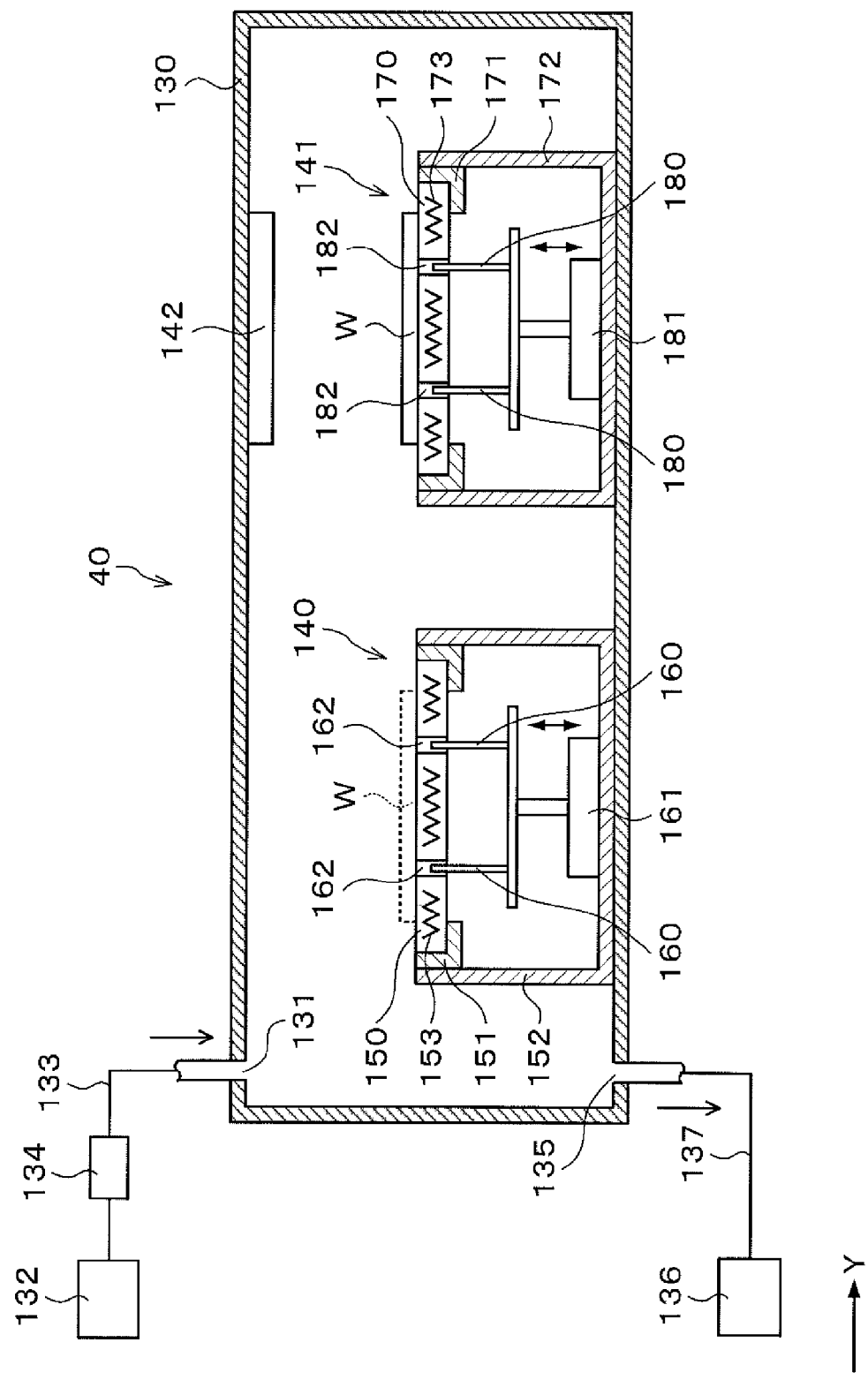
FIG. 6 A longitudinal sectional view illustrating the outline of a configuration of a wafer treatment apparatus.
Figure 7:
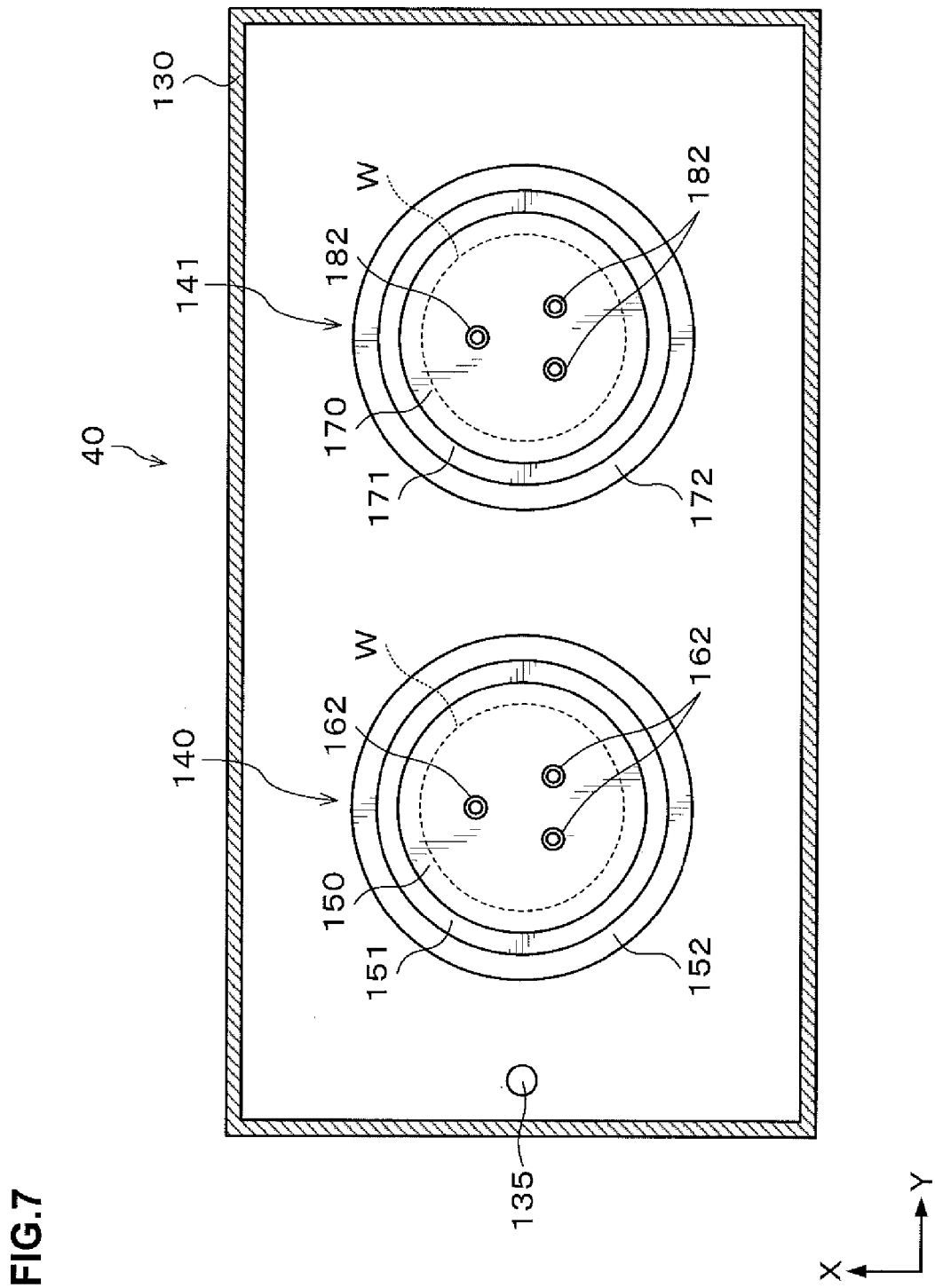
FIG. 7 A transverse sectional view illustrating the outline of the configuration of the wafer treatment apparatus.

Next, the configurations of the above-described wafer treatment apparatuses 40 to 42, 50 to 52 will be described. The wafer treatment apparatus 40 has a treatment container 130 which can hermetically close its inside as illustrated in FIG. 6 and FIG. 7. A transfer-in/out port (not illustrated) for the wafer W is formed, for example, in a side surface on the wafer transfer apparatus 20 side of the treatment container 130, and an opening/closing shutter (not illustrated) is provided at the transfer-in/out port.

On a ceiling surface of the treatment container 130, a gas supply port 131 is formed which supplies, for example, an oxidizing gas into the treatment container 130. To the gas supply port 131, a gas supply pipe 133 communicating with a gas supply source 132 is connected. The gas supply pipe 133 is provided with a supply equipment group 134 including a valve, a flow regulator and so on for controlling the flow of the oxidizing gas.

Note that for the oxidizing gas, gas with an oxygen concentration higher than that is ordinary air is used in this embodiment. However, it is adoptable to bring the inside of the treatment container 130 into an air atmosphere without supplying a specific gas into the treatment container 130. In this case, the gas supply port 131, the gas supply source 132, the gas supply pipe 133, and the supply equipment group 134 may be omitted.

Further, in the illustrated example, the gas supply port 131 is provided on a later-described first thermal treatment unit 140 side but may be provided on an ultraviolet irradiation unit 142 side. In this case, supplying the oxidizing gas from the gas supply port 131 creates a downflow, thereby making it possible to prevent a sublimate or the like generated from the organic film from adhering to the ultraviolet irradiation unit 142 at the time when removing the surface of the organic film on the wafer W by ultraviolet irradiation processing as will be described later.

A bottom surface of the treatment container 130 is formed with a suction port 135 that sucks the atmosphere inside the treatment container 130. To the suction port 135, a suction pipe 137 communicating with a negative pressure generating device 136 such as, for example, a vacuum pump is connected.

Inside the treatment container 130, the first thermal treatment unit 140, a second thermal treatment unit 141 as another thermal treatment unit, and the ultraviolet irradiation unit 142 are provided. The first thermal treatment unit 140 and the second thermal treatment unit 141 are arranged side by side in a Y-direction, and the ultraviolet irradiation unit 142 is arranged above the second thermal treatment unit 141.

The first thermal treatment unit 140 heats the organic material applied on the wafer W in the coating treatment apparatus 30 to 33 to thereby form an organic film on the wafer W.

The first thermal treatment unit 140 includes an annular holding member 151 that accommodates a hot plate 150 and holds the outer peripheral portion of the hot plate 150, and a substantially cylindrical support ring 152 that surrounds the outer periphery of the holding member 151. The hot plate 150 has an almost disk shape with a large thickness, and can mount and heat the wafer W thereon. The hot plate 150 further has, for example, a heating mechanism 153 built therein. For the heating mechanism 153, for example, a heater is used. The heating temperature of the hot plate 150 is controlled by, for example, a control unit 200 so that the wafer W mounted on the hot plate 150 is heated to a predetermined temperature.

Below the hot plate 150, for example, three raising and lowering pins 160 for supporting the wafer W from below and raising and lowering the wafer W are provided. The raising and lowering pins 160 can rise and lower by means of a raising and lowering drive part 161. Near the central portion of the hot plate 150, through holes 162 penetrating the hot plate 150 in the thickness direction thereof are formed, for example, at three positions. The raising and lowering pins 160 are inserted into the through holes 162 to be able to project from the upper surface of the hot plate 150.

The second thermal treatment unit 141 heats the organic film on the wafer W when the ultraviolet irradiation processing is performed by the ultraviolet irradiation unit 142 after the thermal treatment is performed at the first thermal treatment unit 140.

The second thermal treatment unit 141 has the same configuration as that of the first thermal treatment unit 140. More specifically, the second thermal treatment unit 141 includes a hot plate 170 as a thermal treatment plate, a holding member 171, a support ring 172, and a heating mechanism 173. Below the hot plate 170, raising and lowering pins 180 and a raising and lowering drive part 181 are provided. Near the central portion of the hot plate 170, through holes 182 are formed.

The ultraviolet irradiation unit 142 radiates ultraviolet rays with a wavelength of, for example, 172 nm. After the first thermal treatment unit 140 performs the thermal treatment, the ultraviolet irradiation unit 142 performs ultraviolet irradiation processing on the organic film on the wafer W. Note that the ultraviolet irradiation unit 142 is provided supported on the ceiling surface of the treatment container 130 in the illustrated example, but the ultraviolet irradiation unit 142 may be provided on a glass window (not illustrated) provided in the ceiling surface of the treatment container 130. In this case, the ultraviolet rays radiated from the ultraviolet irradiation unit 142 enter the inside of the treatment container 130 through the glass window.

Note that inside the treatment container 130, a transfer mechanism (not illustrated) is provided which transfers the wafer W between the first thermal treatment unit 140 and the second thermal treatment unit 141. Alternatively, the wafer W may be transferred between the first thermal treatment unit 140 and the second thermal treatment unit 141 by the wafer transfer apparatus 20, instead of the transfer mechanism.

Further, the configurations of the wafer treatment apparatuses 41, 42, 50 to 52 are the same as that of the above-described wafer treatment apparatus 40, and therefore description thereof is omitted.

In the above film forming system 1, the control unit 200 is provided as illustrated in FIG. 1. The control unit 200 is, for example, a computer and has a program storage part (not illustrated). In the program storage part, a program is stored which controls the film forming treatment in the film forming system 1. Note that the program may be the one that is stored, for example, in a computer-readable storage medium H such as a computer-readable hard disk (HD), flexible disk (FD), compact disk (CD), magneto-optical disk (MO), or memory card, and installed from the storage medium H into the control unit 200.

Figure 8:
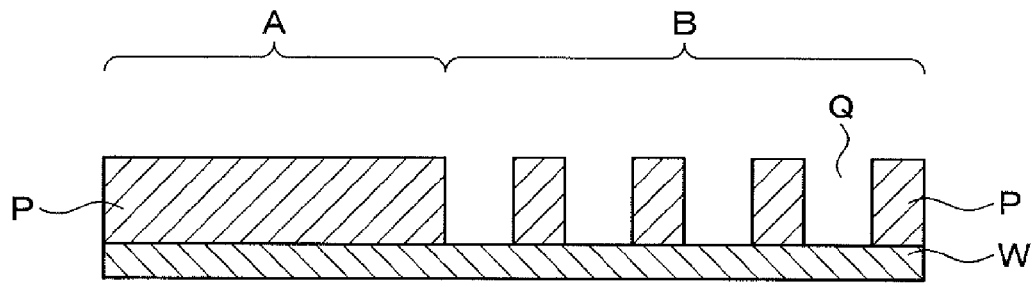
FIG. 8 An explanatory view illustrating a state of a wafer before it is treated in the film forming system.
Figure 9:
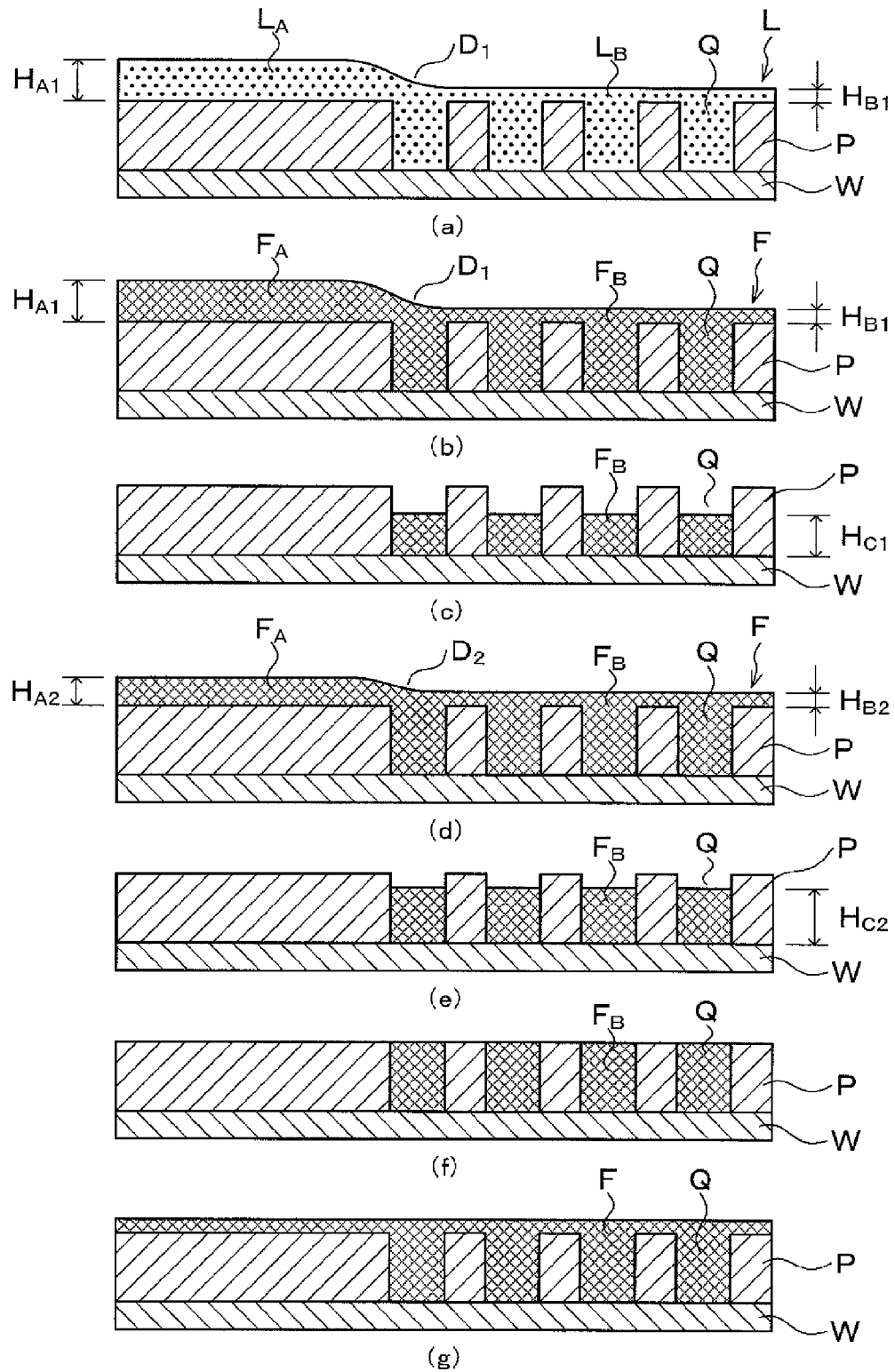
FIG. 9 An explanatory view illustrating states of the wafer at steps of a film forming treatment, (a) illustrating an appearance that an organic material is applied on the wafer, (b) illustrating an appearance that an organic film is formed on the wafer by performing a heat treatment in the first round, (c) illustrating an appearance that the surface of the organic film is removed by performing ultraviolet irradiation processing in the first round, (d) illustrating an appearance that an organic film is formed on the wafer by performing a heat treatment in the second round, (e) illustrating an appearance that the surface of the organic film is removed by performing ultraviolet irradiation processing in the second round, (f) illustrating an appearance that the surface of the organic film is removed by performing ultraviolet irradiation processing in the n-th round, and (g) illustrating an appearance that a predetermined organic film is formed on the wafer.

The film forming system 1 according to this embodiment is configured as described above. Next, the treatment of forming an organic film performed in the film forming system 1 will be described. FIG. 8 illustrates a state of the wafer W before it is treated in the film forming system 1, and FIG. 9 illustrates states of the wafer W at steps of the film forming treatment.

On the wafer W to be treated in the film forming system 1, predetermined patterns P of a $SiO_2$ film or the like have been formed in advance as illustrated in FIG. 8. The patterns P are sparsely and densely formed on the wafer W so that a first region A where no recessed part is formed in the pattern P and a film (the pattern P) covers the surface of the wafer W and a second region B where a recessed part Q is formed between the patterns P, P are formed on the wafer W. In other words, the first region A is a so-called blanket region and the second region B is a region where, for example, line-and-space patterns P are formed.

First, a wafer W is taken out of the cassette C on the cassette mounting table 10 by the wafer transfer body 12 and transferred to the delivery apparatus 21 in the treatment station 3. Then, the wafer W is transferred by the wafer transfer apparatus 20 to the temperature regulation apparatus 43 and temperature-regulated to a predetermined temperature.

The wafer W is then transferred by the wafer transfer apparatus 20 to the coating treatment apparatus 30. The wafer W transferred into the coating treatment apparatus 30 is delivered from the wafer transfer apparatus 20 to the spin chuck 110 and suction-held thereon. Subsequently, the coating nozzle 122 at the waiting section 124 is moved by the arm 121 to a position above the central portion of the wafer W. Thereafter, while the wafer W is being rotated by the spin chuck 110, the organic material is supplied from the coating nozzle 122 onto the wafer W. The supplied organic material is diffused over the entire front surface of the wafer W by the centrifugal force, whereby the organic material is applied on the wafer W (Step S1).

In this event, as illustrated in FIG. 9(a), an organic material L in the second region B (hereinafter, referred to as an "organic material $L_B$") is recessed as compared with an organic material L in the first region A (hereinafter, referred to as an "organic material $L_A$") because of the surface tension and the viscosity of the organic material L applied on the wafer W. More specifically, a height $H_{B1}$ of the organic material $L_B$ from the surface of the pattern P is lower than a height $H_{A1}$ of the organic material $L_A$ from the surface of the pattern P. Thus, a level difference $D_1$ is generated between the organic material $L_A$ and the organic material $L_B$.

Thereafter, the wafer W is delivered by the wafer transfer apparatus 20 to the wafer treatment apparatus 40. In this event, inside the wafer treatment apparatus 40, an normal pressure atmosphere of the oxidizing gas is maintained. The wafer W transferred into the wafer treatment apparatus 40 is first transferred to the first thermal treatment unit 140, and delivered to the raising and lowering pins 160 which have been raised and waiting in advance. Subsequently, the raising and lowering pins 160 are lowered to mount the wafer W on the hot plate 150. The wafer W on the hot plate 150 is heated to a predetermined temperature, for example, 300° C. When the wafer W is heated for a predetermined time, the organic material L on the wafer W is heated to form into an organic film F on the wafer W as illustrated in FIG. 9(b) (Step S2). Note that the above-described level difference $D_1$ is generated between an organic film F in the first region A (hereinafter, sometimes referred to as an "organic film $F_A$") and an organic film F in the second region B (hereinafter, sometimes referred to as an "organic film $F_B$").

Thereafter, the wafer W is transferred to the second thermal treatment unit 141 and delivered to the raising and lowering pins 180 which have been raised and waiting in advance. Subsequently, the raising and lowering pins 180 are lowered to mount the wafer W on the hot plate 170. The wafer W on the hot plate 170 is heated to a predetermined temperature, for example, 300° C.

When the wafer W is mounted on the hot plate 170, the ultraviolet irradiation unit 142 radiates ultraviolet rays with a wavelength of 172 nm. The radiated ultraviolet rays generate active oxygen and ozone in the treatment atmosphere of the oxidizing gas in the treatment container 130. The active oxygen and ozone decompose and remove the surface of the organic film F (Step S3). In short, etchback of the organic film F is performed.

As described above, the removal of the surface of the organic film F is performed by radiating the ultraviolet rays from the ultraviolet irradiation unit 142 while heating the organic film F by the hot plate 170. Further, the removal of the surface of the organic film F is performed down to a predetermined depth where the organic film $F_A$ is completely removed as illustrated in FIG. 9(c), namely, the surface of the organic film F corresponding to the height $H_{A1}$ is removed. Then, the surface of the patterns P is exposed so that the organic film $F_A$ does not exist in the first region A and the organic film $F_B$ with a height $H_{C1}$ ($=H_{A1}-H_{B1}$) exists in the recessed part Q between the patterns P in the second region B.

Note that heating the organic film F at the time when the ultraviolet processing is performed by the ultraviolet irradiation unit 142 makes it possible to efficiently remove the surface of the organic film F in a short time. For example, in the case where the surface of the organic film F at normal temperature (23° C.) is removed by 100 nm, the ultraviolet irradiation processing needs to be performed for 10 minutes, whereas in the case where the surface of the organic film F is removed by 100 nm while the organic film F is being heated at 300° C. as in this embodiment, the ultraviolet irradiation processing only needs to be performed for 30 seconds for instance.

Further, the wavelength of the ultraviolet rays radiated from the ultraviolet irradiation unit 142 is not particularly limited, but is preferably 172 nm as in this embodiment. The ultraviolet rays with a shorter wavelength has a greater power at the time of performing the ultraviolet irradiation processing and can efficiently remove the surface of the organic film F. However, the ultraviolet rays with a shorter wavelength is more likely to be absorbed by a substance existing in the treatment container 130. Hence, the wavelength of the ultraviolet rays is preferably 172 nm in consideration of the balance between the efficiency of removing the surface of the organic film F and the difficulty of being absorbed by the substance.

Then, the wafer W is transferred by the wafer transfer apparatus 20 to the temperature regulation apparatus 44 and temperature-regulated to a predetermined temperature.

The coating treatment of the organic material L onto the wafer W at Step S1, the heating treatment on the organic material L on the wafer W at Step S2, and the surface removal treatment on the organic film F on the wafer W at Step S3 are performed in sequence as described above to form the organic film F on the wafer W. Then, those Steps S1 to S3 are performed multiple rounds, for example, n rounds. Note that the temperature regulation of the wafer W in the temperature regulation apparatus 43, 44, 53, 54 is performed after Step S3 in each round, but description thereof will be omitted in the following.

Next, Steps S1 to S3 in the second round will be described. Note that Steps S1 to S3 in the second round are the same steps as Steps S1 to S3 in the first round, and only the essential points will be described in the following description.

At Step S1 in the second round, the organic material L is applied on the wafer in the coating treatment apparatus 31. At Step S1 in the second round, the organic material L is applied into a film thickness smaller than that at Step S1 in the first round. Specifically, for example, increasing the number of rotations of the spin chuck 110, decreasing the supply amount of the organic material L to be supplied onto the wafer W or the like is performed to make the film thickness of the organic material L in the second round smaller than the film thickness of the organic material L in the first round. Then, heights $H_{A2}$, $H_{B2}$ of the organic films $F_A$, $F_B$ (organic materials $L_A$, $L_B$) in the second round are smaller than the heights $H_{A1}$, $H_{B1}$ of the organic films $F_A$, $F_B$ in the first round as illustrated in FIG. 9(d).

Thereafter, at Step S2 in the second round, the organic material L on the wafer W is heated at the first thermal treatment unit 140 of the wafer treatment apparatus 41, whereby an organic film F is formed on the wafer W as illustrated in FIG. 9(d). In this event, a level difference $D_2$ has been generated between the organic film $F_A$ and the organic film $F_B$. However, the level difference $D_2$ is smaller, by the reduced film thickness of the organic material L at Step S1 in the second round, than the above-described level difference $D_1$ in the first round.

Thereafter, at Step S3 in the second round, the ultraviolet irradiation unit 142 radiates the ultraviolet rays while the organic film F on the wafer W is being heated at the second thermal treatment unit 141 of the wafer treatment apparatus 41, to thereby remove the surface of the organic film F as illustrated in FIG. 9(e). The removal of the surface of the organic film F is performed until the organic film $F_A$ is completely removed, namely, the surface of the organic film F corresponding to the height $H_{A2}$ is removed. Then, the organic film $F_A$ does not exist in the first region A and the organic film $F_B$ with a height $H_{C2}$ ($=H_{A1}-H_{B1}$) remains in the recessed part Q between the patterns P in the second region B. Note that the height $H_{C2}$ of the organic film $F_B$ remaining after Step S3 in the second round is larger than the height $H_{C1}$ of the organic film $F_B$ remaining after Step S3 in the first round. In other words, the organic film $F_B$ accumulates in the recessed part Q between the patterns P every time the round of Steps S1 to S3 is repeated.

As at the above Steps S1 to S3 in the second round, Steps S1 to S3 in the third round to the n-th round are performed. Then, level differences $D_3$ to $D_n$ between the organic film $F_A$ and the organic film $F_B$ become smaller, and the level difference $D_n$ finally becomes almost zero. Then, the height of the surface of the organic film $F_B$ and the height of the surface of the pattern P become the same as illustrated in FIG. 9(f). Note that the level difference $D_n$ does not need to be completely zero but only needs to fall within a required predetermined range.

Thereafter, the organic material L with a predetermined thickness is applied onto the wafer W in the coating treatment apparatus 32, and the organic material L on the wafer W is heated at the first thermal treatment unit 140 of the wafer treatment apparatus 42. In this manner, an organic film F with a predetermined film thickness and with a planarized surface is formed on the wafer W as illustrated in FIG. 9(g).

Forming the organic film F is ended after Steps S1 and S2 are performed to apply and heat the organic material L at the end in this embodiment, but may be ended after Step S3 is performed to remove the surface of the organic film F. Ending at which step only needs to be decided according to the specifications of a required product. Further, in the case of ending after the surface of the organic film F is removed, it is only necessary to remove the surface of the organic film F so that the film thickness of the organic film F becomes a predetermined film thickness and, for example, the surface of the organic film F may be removed to the state illustrated in FIG. 9($g$).

Thereafter, the wafer W is transferred by the wafer transfer apparatus 20 to the delivery apparatus 21 and returned by the wafer transfer body 12 to the cassette C. Thus, a series of film forming treatment in the film forming system 1 ends.

According to the above embodiment, the ultraviolet irradiation unit 142 radiates the ultraviolet rays at Step S3 to generate active oxygen and ozone in the treatment atmosphere, and the active oxygen and ozone can remove the surface of the organic film F on the wafer W. Then, repeating Steps S1 to S3 makes the level difference $D_n$ between the organic film $F_A$ and the organic film $F_B$ almost zero to thereby planarize the surface of the organic film F on the wafer W. As a result, organic films F with various film thicknesses (for example, several tens of micrometers to several tens of nanometers) can be formed on the wafer W.

Further, at the time when the ultraviolet irradiation unit 142 radiates the ultraviolet rays at Step S3, the hot plate 170 heats the organic film F, so that it is possible to efficiently perform the removal of the surface of the organic film F in a short time.

Further, the ultraviolet irradiation unit 142 radiates the ultraviolet rays while the hot plate 170 is heating the organic film F to thereby remove the surface of the organic film F at Step S3, thus preventing damage to the wafer W or the pattern P on the wafer W and an interlayer insulating film such as a Low-K film unlike the case of performing the conventional dry etching method, and also eliminating the possibility that the pattern P and the interlayer insulating film are changed in quality. Accordingly, an organic film F can be appropriately formed on the wafer W.

Further, when the conventional dry etching method was carried out for removing the surface of the organic film F, the accuracy of the surface removal was at a level of several nanometers. In contrast, the earnest study by the inventors results in the finding that in the case of performing the ultraviolet irradiation processing at Step S3 as in this embodiment, the accuracy of the surface removal can be made to a level of 0.1 nm. Therefore, according to this embodiment, the accuracy of the surface removal of the organic film F can be improved.

Further, when the conventional dry etching method was carried out for removing the surface of the organic film F, a microloading effect exerts thereon so that the surface removing rate (etching rate) is high at the portion where the patterns P are sparsely formed and the surface removing rate is low at the portion where the patterns P are densely formed. Therefore, it is impossible to uniformly remove the surface of the organic film F, thus failing to planarize the surface of the organic film F. In contrast, the ultraviolet irradiation processing is performed in a uniform treatment atmosphere at Step S3 as in this embodiment, so that the surface of the organic film F can be uniformly removed. Therefore, the surface of the organic film F can be planarized.

Further, according to this embodiment, all of the coating treatment of the organic material L at Step S1, the heating treatment on the organic material L at Step S2, and the surface removal treatment of the organic film F at Step S3 can be performed under the normal pressure atmosphere, and these steps can be performed in one film forming system 1. Therefore, as compared to the case where the etchback method is performed as in the prior art and the treatment under the normal pressure atmosphere and the treatment under the vacuum atmosphere are performed in separate systems, the manufacturing cost of the film forming system 1 in this embodiment can be reduced, and the throughput of the wafer treatment can be improved.

Further, according to this embodiment, when removing the surface of the organic film F at Step S3, scum (resist residue) between the patterns P can also be removed. Moreover, rework of the pattern P (resist pattern) becomes possible.

Note that at Step S3 in the above embodiment, the rate of removing the surface of the organic film F is controlled by the heating temperature by the hot plate 170 in the second thermal treatment unit 141. For example, when the heating temperature is increased, the rate of removing the surface of the organic film F is increased.

Further, the rate of removing the surface of the organic film F is controlled also by the oxygen concentration of the treatment atmosphere, the illuminance of the ultraviolet rays, or the irradiation time of the ultraviolet rays. For example, when the oxygen concentration of the treatment atmosphere is increased, the active oxygen and ozone generated in the treatment atmosphere increase to increase the rate of removing the surface of the organic film F. Further, when the illuminance of the ultraviolet rays is increased, the rate of removing the surface of the organic film F increases. Further, when the irradiation time of the ultraviolet rays is increased, the rate of removing the surface of the organic film F increases.

How many rounds of Steps S1 to S3 are repeated in the above embodiment can be arbitrarily set according to various conditions such as the required film thickness of the organic film F, the predetermined range required for the level difference $D_n$ and so on.

Further, Steps S1 to S3 are performed multiple rounds in the above embodiment, but these Steps S1 to S3 only need to be performed once when the level difference $D_1$ in the first round falls within the required predetermined range.

Figure 10:
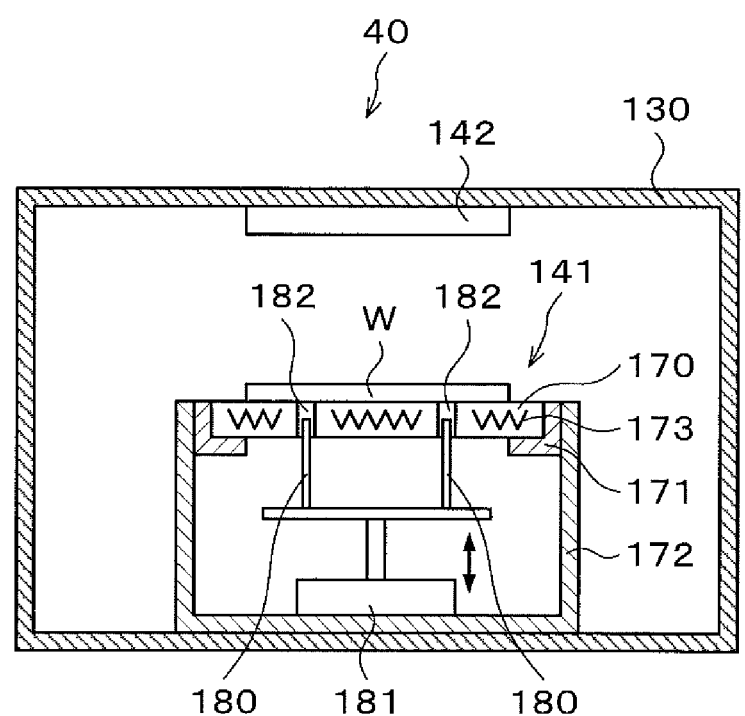
FIG. 10 A longitudinal sectional view illustrating the outline of a configuration of a wafer treatment apparatus according to another embodiment.

Though the first thermal treatment unit 140 and the second thermal treatment unit 141 are separately provided in the wafer treatment apparatus 40 in the above embodiment, the first thermal treatment unit 140 may be omitted and the second thermal treatment unit 141 may serve also as the first thermal treatment unit 140 as illustrated in FIG. 10. In this case, the organic material L on the wafer W is heated by the hot plate 170 at Step S2. Subsequently, at Step S3, the ultraviolet irradiation unit 142 radiates the ultraviolet rays while the hot plate 170 is heating the organic film F to thereby remove the surface of the organic film F.

According to this embodiment, the first thermal treatment unit 140 can be omitted, so that the manufacturing cost of the wafer treatment apparatus 40 can be reduced, and the footprint of the wafer treatment apparatus 40 can be made small. In particular, when the heating temperature at Step S2 and the heating temperature at Step S3 are the same, the temperature of the hot plate 170 can be kept constant, and therefore this embodiment is useful in such a case.

Figure 11:
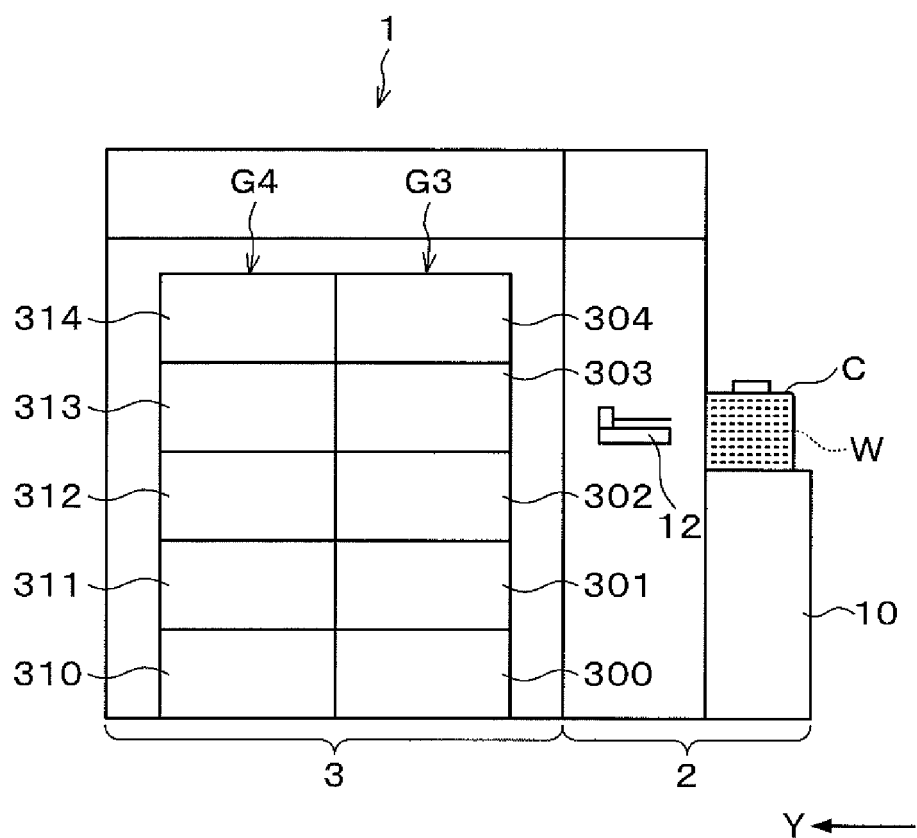
FIG. 11 A side view illustrating the outline of an internal configuration of a film forming system according to another embodiment.

The first thermal treatment unit 140 and the second thermal treatment unit 141 are provided in one wafer treatment apparatus 40 in the above embodiment, but may be provided in individual apparatuses. For example, as illustrated in FIG. 11, thermal treatment apparatuses 300, 301 each including the first thermal treatment unit 140 and wafer treatment apparatuses 302, 303, 304 each including the second thermal treatment unit 141 and the ultraviolet irradiation unit 142 may be arranged in the third treatment block G3. Similarly, thermal treatment apparatuses 310, 311 each including the first thermal treatment unit 140 and wafer treatment apparatuses 312, 313, 314 each including the second thermal treatment unit 141 and the ultraviolet irradiation unit 142 may be arranged also in the fourth treatment block G4. Note that the temperature regulation apparatus that regulates the temperature of the wafer W is omitted in the illustrated example.

As described above, the rate of removing the surface of the organic film F at Step S3 is controlled, for example, by the heating temperature by the hot plate 170 in the second thermal treatment unit 141. Further, in the case where Step S3 is performed multiple rounds, the film thickness of the organic film F in each round becomes smaller and the level difference D between the organic film $F_A$ and the organic film $F_B$ becomes smaller every time the round is repeated, and therefore the rate of removing the surface of the organic film F at Step S3 in each round is sometimes decreased.

Hence, the plurality of wafer treatment apparatuses 302 to 304, 312 to 314 are provided in this embodiment, so that the heating temperatures of the hot plates 170 in the wafer treatment apparatuses 302 to 304, 312 to 314 can be set to different temperatures. Thus, this embodiment is also applicable to the case where the rate of removing the surface of the organic film F at Step S3 in each round is different as described above. More specifically, it is unnecessary to increase or decrease the heating temperature of each hot plate 170 so that the heating temperature of each hot plate 170 can be kept constant, thus further improving the throughput of the wafer treatment.

Though the heat treatment on the organic film F at Step S3 is performed by the hot plate 170 in the above embodiment, but the heat treatment method for the organic film F is not limited to this.

Figure 12:
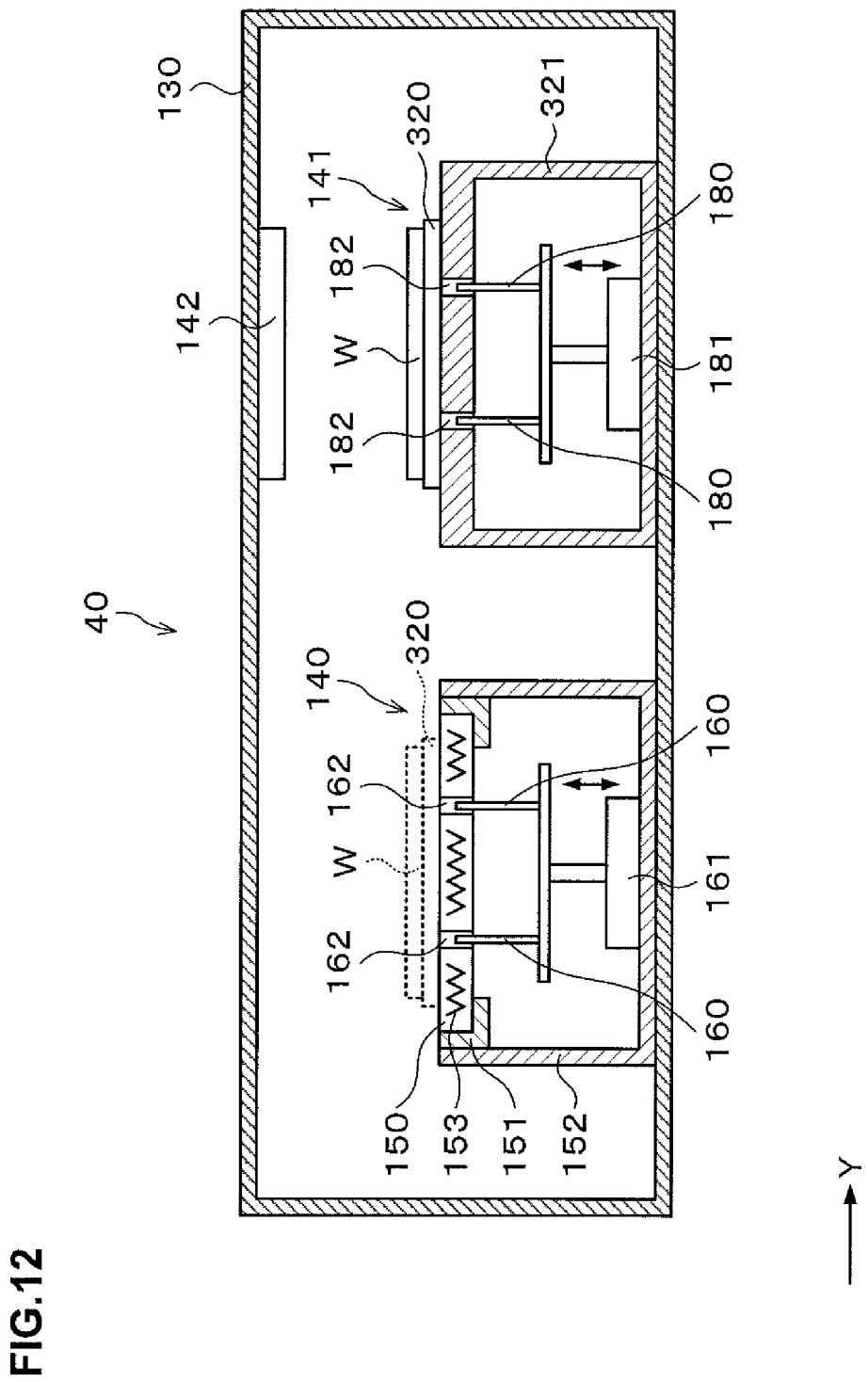
FIG. 12 A longitudinal sectional view illustrating the outline of a configuration of a wafer treatment apparatus according to another embodiment.

For the heat treatment on the organic film F at Step S3, for example, a heat insulating material 320 may be used in place of the hot plate 170 as illustrated in FIG. 12. At the second thermal treatment unit 141 of the wafer treatment apparatus 40, a mounting table 321 that mounts the heat insulating material 320 thereon is provided in place of the hot plate 170, the holding member 171, the support ring 172, and the heating mechanism 173 in the above embodiment. The above-described raising and lowering pins 180 and raising and lowering drive part 181 are provided inside the mounting table 321, and the through holes 182 are formed in the upper surface of the mounting table 321.

The heat insulating material 320 can hold the wafer W and keep the wafer W warm. For the heat insulating material 320, a material with a large heat capacity, for example, quartz glass is used. Further, the heat insulating material 320 is configured to be movable, by a moving mechanism (not illustrated), above the hot plate 150 of the first thermal treatment unit 140 and the mounting table 321 of the second thermal treatment unit 141. Note that the other configuration of the wafer treatment apparatus 40 is the same as the configuration of the wafer treatment apparatus 40 in the above embodiment, and description thereof will be omitted.

In this case, when the wafer W is heated to a predetermined temperature, for example, 300° C. on the hot plate 150 of the first thermal treatment unit 140 at Step S2, the heat insulating material 320 is also heated to the same temperature. Thereafter, the wafer W held on the heat insulating material 320 is transferred to the mounting table 321. Then, when the ultraviolet irradiation unit 142 performs the ultraviolet processing at Step S3, the temperature of the wafer W is kept by the heat insulating material 320. Therefore, it is possible to radiate ultraviolet rays from the ultraviolet irradiation unit 142 while the organic film F on the wafer W is being heated at Step S3. According to this embodiment, the same effects as those in the above embodiment can be provided. In other words, it is possible to efficiently remove the surface of the organic film F.

Figure 13:
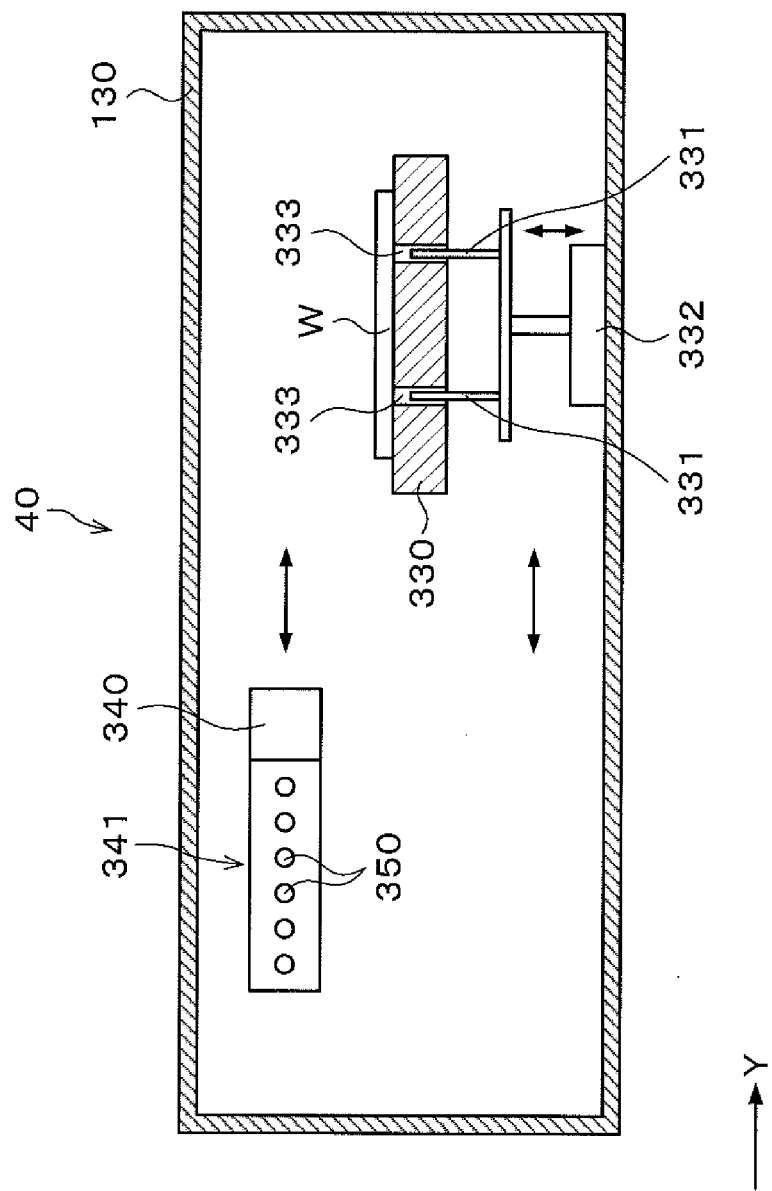
FIG. 13 A longitudinal sectional view illustrating the outline of a configuration of a wafer treatment apparatus according to another embodiment.

For the heat treatment on the organic film F at Step S3, an LED (Light Emitting Diode) as a light source may be used in place of the hot plate 170. For example, a mounting plate 330 that mounts the wafer W thereon is provided inside the treatment container 130 of the wafer treatment apparatus 40 as illustrated in FIG. 13. The mounting plate 330 is configured to be movable in a Y-direction begin a horizontal direction by a moving mechanism (not illustrated). Below the mounting plate 330, for example, three raising and lowering pins 331 for supporting the wafer W from below and raising and lowering the wafer W are provided. The raising and lowering pins 331 can rise and lower by means of a raising and lowering drive part 332. Near the central portion of the mounting plate 330, through holes 333 penetrating the mounting plate 330 in the thickness direction thereof are formed, for example, at three positions. The raising and lowering pins 331 are inserted into the through holes 333 to be able to project from the upper surface of the mounting plate 330.

Above the mounting plate 330, an ultraviolet irradiation unit 340 and a second thermal treatment unit 341 are integrally provided. The ultraviolet irradiation unit 340 and the second thermal treatment unit 341 are configured to be movable in the Y-direction being the horizontal direction by a moving mechanism (not illustrated).

The ultraviolet irradiation unit 340 radiates ultraviolet rays with a wavelength of 172 nm similarly to the ultraviolet irradiation unit 142.

In the second thermal treatment unit 341, a plurality of LEDs 350 are arranged side by side in a line in the Y-direction. The LEDs 350 are provided to be longer than the length in a diameter direction of the wafer W. In other words, the LEDs 350 can emit irradiating light to the entire diameter direction of the wafer W on the mounting table 330.

Note that a thermal treatment apparatus (not illustrated) including the first thermal treatment unit 140 is separately provided in the film forming system 1 in this embodiment.

In this case, at Step S3, the mounting plate 330 mounting the wafer W thereon moves to a Y-direction negative direction side and the ultraviolet irradiation unit 340 and the second thermal treatment unit 341 move to a Y-direction positive direction side. In other words, the mounting plate 330 and the ultraviolet irradiation unit 340 move to relatively get close to each other. Note that both of the mounting plate 330, and the ultraviolet irradiation unit 340 and the second thermal treatment unit 341 are moved in this embodiment, but either of them may be moved.

Then, while the irradiating light emitted from the LEDs 350 of the second thermal treatment unit 341 is heating the organic film F on the wafer W, the ultraviolet irradiation unit 340 radiates the ultraviolet rays. Then, the surface of the organic film F is removed as in the above embodiment. Therefore, according to this embodiment, the same effects as those in the above embodiment can be provided. In other words, it is possible to efficiently remove the surface of the organic film F.

Note that the rate of removing the surface of the organic film F can be controlled by the emission intensity of the LEDs 350 in the second thermal treatment unit 341, the number of LEDs 350, the wavelength of the irradiating light emitted from the LEDs 350 and so on at Step S3 in the above embodiment.

Further, in the case where Step S3 is performed multiple rounds as described above, it is necessary to make the rate of removing the surface of the organic film F in each round smaller. Even in this case, the rate of removing the surface of the organic film F can be controlled by appropriately selecting the method of controlling the emission intensity of the LEDs 350, controlling the number of emission times of the LEDs 350 through on-off control of the LEDs 350, controlling the wavelength of the irradiating light emitted from the LEDs 350 or the like or combining them. Furthermore, since the reaction speed of the LEDs 350 is high, it is possible to easily control increase and decrease in heating temperature for the organic film F or locally control increase and decrease in heating temperature for the organic film F. Accordingly, it is possible to more efficiently remove the surface of the organic film F.

Note that though the LEDs 350 are used as the light source in the second thermal treatment unit 341 in the above embodiment, various light sources such as a laser, a halogen lamp and the like can also be used in place of the LEDs 350.

In the above embodiment, the film forming system 1 may have a film thickness measurement apparatus as a film thickness measurement unit that measures the film thickness of a predetermined organic film F after the organic film F is formed on the wafer W. The film thickness measurement apparatus is provided stacked, for example, on the delivery apparatus 21 in the film forming system 1.

Figure 14:
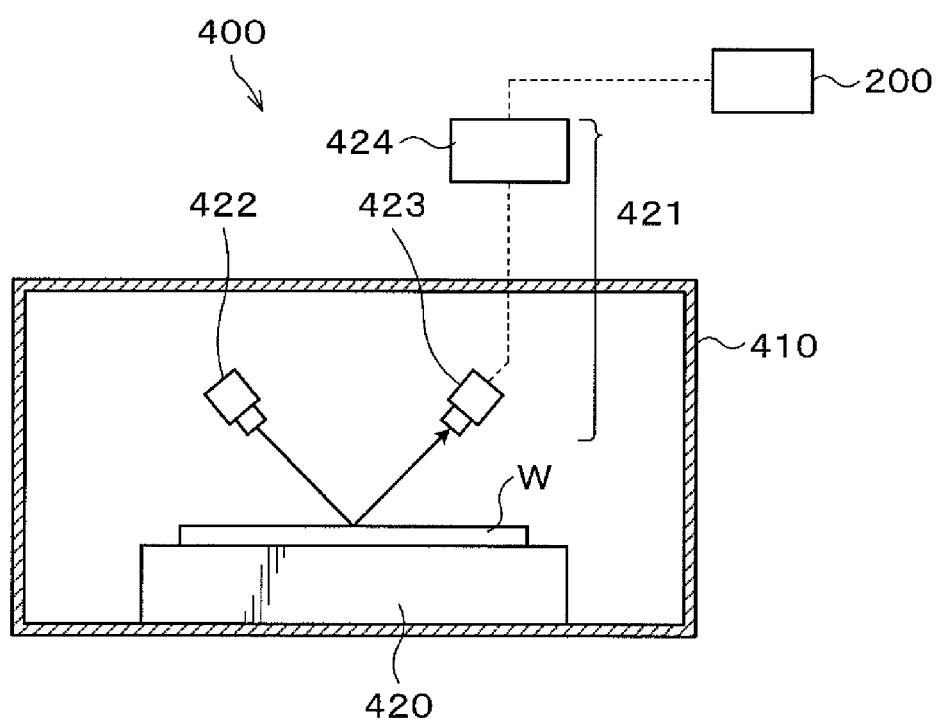
FIG. 14 A longitudinal sectional view illustrating the outline of a configuration of a film thickness measurement apparatus.

As illustrated in FIG. 14, a film thickness measurement apparatus 400 has a treatment container 410. A transfer-in/out port (not illustrated) for the wafer W is formed, for example, in a side surface on the wafer transfer apparatus 20 side of the treatment container 410, and an opening/closing shutter (not illustrated) is provided at the transfer-in/out port.

At a bottom surface in the treatment container 410, a mounting table 420 that mounts the wafer W thereon and an optical surface shape measuring device 421 are provided. The mounting table 420 can move, for example, in two-dimensional directions being horizontal directions. The optical surface shape measuring device 421 has a light irradiation part 422 that radiate light, for example, from an oblique direction with respect to the wafer W, a light detection part 423 that detects light radiated from the light irradiation part 422 and reflected off the wafer W, and a measurement part 424 that calculates the film thickness of the organic film F on the wafer W on the basis of light reception information by the light detection part 423. The film thickness measurement apparatus 400 measures the film thickness of the organic film F using, for example, the Scatterometry, and can measure the film thickness of the organic film F by collating the light intensity distribution within the wafer detected by the light detection part 423 with a virtual light intensity distribution stored in advance and finding the film thickness of the organic film F corresponding to the collated virtual light intensity distribution in the measurement part 424.

In this case, the wafer W is first mounted on the mounting table 420 in the film thickness measurement apparatus 400. Subsequently, light is radiated from the light irradiation part 422 to the wafer W, and its reflected light is detected by the light detection part 423. Then, at the measurement part 424, the film thickness of the organic film F on the wafer W is measured. The film thickness measurement result of the organic film F is outputted to the control unit 200.

When, based on the film thickness measurement result of the organic film F, the film thickness of the organic film F is made into a predetermined film thickness and the organic film F is planarized, namely, the level difference D in the organic film F falls within the predetermined range, the wafer treatment is performed under the treatment conditions as they are to subsequent wafers.

On the other hand, if the organic film F has not been sufficiently planarized, the treatment conditions at Step S3 are corrected. Specifically, for example, the heating temperature at the second thermal treatment unit 141, 341 is corrected. Further, the treatment condition such as the illuminance of the ultraviolet rays from the ultraviolet irradiation unit 142, 340, the irradiation time of the ultraviolet rays or the like is corrected. Further, the oxygen concentration of the treatment atmosphere at Step S3 is corrected.

According to this embodiment, the wafer treatment can be performed under more suitable conditions, so that the organic film F can be more appropriately formed on the wafer W.

Note that though the ultraviolet irradiation processing is performed while the organic film F is being heated at Step S3 in the above embodiment, the earnest study by the inventors results in the finding that the surface of the organic film F can be appropriately removed even by performing only the ultraviolet irradiation processing.

Preferred embodiments of the present invention have been described above with reference to the accompanying drawings, but the present invention is not limited to the embodiments. It should be understood that various changes and modifications are readily apparent to those skilled in the art within the scope of the spirit as set forth in claims, and those should also be covered by the technical scope of the present invention.

EXPLANATION OF CODES 1 film forming system
30 to 33 coating treatment apparatus
40 to 42, 50 to 52 wafer treatment apparatus
140 first thermal treatment unit
141 second thermal treatment unit
142 ultraviolet irradiation unit
150 hot plate
170 hot plate
200 control unit
300, 301, 310, 311 thermal treatment apparatus
302 to 304, 312 to 314 wafer treatment apparatus
320 heat insulating material
340 ultraviolet irradiation unit
341 second thermal treatment unit
350 LED
400 film thickness measurement apparatus
A first region
B second region
D level difference
F organic film
$F_A$ organic film (in first region A)
$F_B$ organic film (in second region B)
L organic material
$L_A$ organic material (in first region A)
$L_B$ organic material (in second region B)

P pattern
Q recessed part
W wafer

What is claimed:

1. A film forming method of forming an organic film on a substrate having a pattern formed on a front surface thereof, the method comprising:
 a coating treatment step of applying an organic material onto the substrate;
 a thermal treatment step of then thermally treating the organic material to form an organic film on the substrate; and
 an ultraviolet irradiation step of then performing ultraviolet irradiation processing on the organic film to remove a surface of the organic film down until a surface of the pattern is exposed,
 wherein the coating treatment step is performed again after the coating treatment step, the thermal treatment step, and the ultraviolet irradiation step are performed.

2. The film forming method according to claim 1,
 wherein at the ultraviolet irradiation step, the ultraviolet irradiation processing is performed while the organic film is being heated.

3. The film forming method according to claim 2,
 wherein the thermal treatment at the ultraviolet irradiation step is performed by mounting the substrate on a thermal treatment plate.

4. The film forming method according to claim 3,
 wherein a plurality of the thermal treatment plates are provided and perform the thermal treatment at the ultraviolet irradiation step at different temperatures respectively.

5. The film forming method according to claim 2,
 wherein the thermal treatment at the ultraviolet irradiation step is performed by irradiating light from a light source.

6. The film forming method according to claim 1,
 wherein at the ultraviolet irradiation step, at least an oxygen concentration of a treatment atmosphere, an illuminance of ultraviolet rays, or an irradiation time of the ultraviolet rays is controlled.

7. The film forming method according to claim 1, further comprising:
 a film thickness measurement step of measuring a film thickness of the organic film after the ultraviolet irradiation step,
 wherein a treatment condition of the ultraviolet irradiation step is corrected based on a measurement result at the film thickness measurement step.

8. A computer-readable storage medium storing a program running on a computer of a control unit controlling a film forming system to cause the film forming system to perform a film forming method of forming an organic film on a substrate having a pattern formed on a front surface thereof,
 the film forming method comprising:
 a coating treatment step of applying an organic material onto the substrate;
 a thermal treatment step of then thermally treating the organic material to form an organic film on the substrate; and
 an ultraviolet irradiation step of then performing ultraviolet irradiation processing on the organic film to remove a surface of the organic film down until a surface of the pattern is exposed,
 wherein the coating treatment step is performed again after the coating treatment step, the thermal treatment step, and the ultraviolet irradiation step are performed.

9. A film forming system for forming an organic film on a substrate having a pattern formed on a front surface thereof, the system comprising:
 a coating treatment unit that applies an organic material onto the substrate;
 a thermal treatment unit that thermally treats the organic material to form an organic film on the substrate;
 an ultraviolet irradiation unit that performs ultraviolet irradiation processing on the organic film; and
 a control unit that controls the coating treatment unit, the thermal treatment unit, and the ultraviolet irradiation unit to perform the coating treatment, the thermal treatment, and the ultraviolet irradiation processing in this order and remove a surface of the organic film down until a surface of the pattern is exposed in the ultraviolet irradiation processing,
 wherein the control unit controls the coating treatment unit, the thermal treatment unit, and the ultraviolet irradiation unit to perform the coating treatment again after performing the coating treatment, the thermal treatment, and the ultraviolet irradiation processing.

10. The film forming system according to claim 9, further comprising:
 another thermal treatment unit that thermally treats the organic film when the ultraviolet irradiation processing is performed.

11. The film forming system according to claim 10,
 wherein the another thermal treatment unit has a thermal treatment plate that mounts and thermally treats the substrate thereon.

12. The film forming system according to claim 11,
 wherein a plurality of the thermal treatment plates are provided and perform the thermal treatment at different temperatures respectively.

13. The film forming system according to claim 10,
 wherein the another thermal treatment unit has a light source that radiates irradiating light to the organic film.

14. The film forming system according to claim 9,
 wherein the thermal treatment unit and the ultraviolet irradiation unit are provided in a same apparatus, and
 wherein in the apparatus, a heat insulating material that is movable between the thermal treatment unit and the ultraviolet irradiation unit and holds the substrate and keeps the substrate warm.

15. The film forming system according to claim 9,
 wherein the control unit controls at least an oxygen concentration of a treatment atmosphere, an illuminance of ultraviolet rays, or an irradiation time of the ultraviolet rays in the ultraviolet irradiation processing.

16. The film forming system according to claim 9, further comprising:
 a film thickness measurement unit that measures a film thickness of the organic film after the ultraviolet irradiation processing is performed,
 wherein the control unit corrects a treatment condition of the ultraviolet irradiation processing, based on a measurement result by the film thickness measurement unit.

* * * * *